United States Patent
Wang et al.

(10) Patent No.: US 8,405,949 B2
(45) Date of Patent: Mar. 26, 2013

(54) CURRENT SENSOR FOR MEASURING INHOMOGENEITY OF POTENTIAL DISTRIBUTION OF ARRESTER

(75) Inventors: Baoshan Wang, Wuhan (CN); Xi Zhang, Wuhan (CN); Lin Tang, Wuhan (CN); Yi Xiong, Wuhan (CN); Zhongqiu Zuo, Wuhan (CN); Jinchao Jia, Wuhan (CN); Li Chen, Wuhan (CN)

(73) Assignee: China Electric Power Research Institute, Wuhan (CN)

(*) Notice: Subject to any disclaimer, the term of this patent is extended or adjusted under 35 U.S.C. 154(b) by 841 days.

(21) Appl. No.: 12/565,021

(22) Filed: Sep. 23, 2009

(65) Prior Publication Data

US 2010/0076707 A1   Mar. 25, 2010

(30) Foreign Application Priority Data

Sep. 24, 2008   (CN) .......................... 2008 1 0197054

(51) Int. Cl.
   *H02H 3/22*   (2006.01)

(52) U.S. Cl. ....................................................... 361/117
(58) Field of Classification Search .................... 361/117
See application file for complete search history.

(56) References Cited

U.S. PATENT DOCUMENTS

| 6,590,687 B1* | 7/2003 | Olsen ............................ 398/189 |
| 2005/0199981 A1* | 9/2005 | Walters ......................... 257/601 |
| 2006/0055392 A1* | 3/2006 | Passmore et al. ............. 324/71.1 |
| 2009/0057540 A1* | 3/2009 | Nyffenegger et al. ... 250/227.11 |

OTHER PUBLICATIONS

Taskin, Turgut; , "Introduction of a Measurement System to Monitor the Condition of ZnO Surge Arresters," Power Engineering Society Winter Meeting, 2000. IEEE , vol. 3, no., pp. 1553-1557 vol. 3, Jan. 23-27, 2000.*

* cited by examiner

*Primary Examiner* — Jared Fureman
*Assistant Examiner* — Scott Bauer
(74) *Attorney, Agent, or Firm* — Matthias Scholl P.C.; Matthias Scholl

(57) ABSTRACT

A current sensor for measuring the inhomogeneity of potential distribution of an arrester having a metal casing, a protection circuit of sampling resistor, a signal conditioning circuit, a signal acquisition circuit, an electro-optical conversion circuit, and a battery module. The signal acquisition circuit includes MSP430F149 micro controller unit having an A/D converter and a serial port. The current sensor is an active sensor, works in a high floating potential, and has a good real time response, high accuracy, low power consumption, good electromagnetic compatibility, and strong anti-interference capability even under harsh electromagnetic conditions.

4 Claims, 5 Drawing Sheets

CURRENT SENSOR FOR MEASURING INHOMOGENEITY OF POTENTIAL DISTRIBUTION OF ARRESTER

CROSS-REFERENCE TO RELATED APPLICATIONS

Pursuant to 35 U.S.C. §119 and the Paris Convention Treaty, this application claims priority benefits to Chinese Patent Application No. 200810197054.6 filed on Sep. 24, 2008, the contents of which are incorporated herein by reference.

BACKGROUND OF THE INVENTION

1. Field of the Invention

The invention relates to a current sensor, and more particularly to a current sensor for measuring the inhomogeneity of potential distribution of gapless metal oxide arresters.

2. Description of the Related Art

To ensure the safe operation of metal oxide arresters, before mass production, studies on the whole potential distribution is a must. If the inhomogeneous coefficient of potential distribution of the arresters is bigger than a set standard, the local electric load rate of resistors will be too high, which may result in thermal breakdown of the resistors and safety accidents of power systems. Nowadays, a commonly-used method of measuring potential distribution is fiber-current methods.

For conventional equipment of measuring potential distribution, the sensing head is generally a passive device. Current intensity measured by the sensing head is often modulated into light intensity signals or frequency signals and sent to a signal processing unit at a low voltage side by fibers. However, the acquired current signals have bad real time, and relevant information such as current waveform, effective value, peak value, and frequency is not available, so the potential distribution of metal oxide arresters can not be measured more accurately.

SUMMARY OF THE INVENTION

In view of the above-described problems, it is one objective of the invention to provide a current sensor for measuring the inhomogeneity of potential distribution of an arrester that is featured by high accuracy, good real time, low power consumption, and strong anti-interference capability.

To achieve the above objectives, in accordance with one embodiment of the invention, provided is a current sensor for measuring the inhomogeneity of potential distribution of an arrester that is featured by high accuracy, good real time, low power consumption, and strong anti-interference capability, comprising a metal casing, a protection circuit of sampling resistor, a signal conditioning circuit, a signal acquisition circuit, an electro-optical conversion circuit, and a battery module; enclosed by the metal casing, the protection circuit of sampling resistor, the signal conditioning circuit, the signal acquisition circuit, and the electro-optical conversion circuit are connected sequentially and electrically; and the battery module is separately connected to and provides power for the signal conditioning circuit, the signal acquisition circuit, and the electro-optical conversion circuit.

In a class of this embodiment, the protection circuit of sampling resistor comprises a transient voltage suppression diode, and the transient voltage suppression diode is connected to the sampling resistor by parallel connection.

In a class of this embodiment, the signal acquisition circuit comprises MSP430F149 micro controller unit as a signal acquisition and communication chip, the MSP430F149 micro controller unit comprising an 12 bits A/D converter and a serial port, the 12 bits A/D converter converting analog voltage signal into binary digital signal, and the serial port sending encoded binary digital signal to the electro-optical conversion circuit.

In a class of this embodiment, the encoded binary digital signal is processed by the electro-optical conversion circuit and sent to a signal processing unit at a low voltage side by a single fiber channel for further processing.

In a class of this embodiment, the metal casing is made of aluminum, and the shape of the metal casing is the same as that of the original metallic pad of the arrester.

The working principle of the current sensor of the invention is summarized as below. The shape of the metal casing of the current sensor is the same as that of the original metallic pad of the arrester. Instead of the metallic pad, the current sensor is disposed between resistors. When voltage is applied to the arrester, current is generated and flows through the resistors and the protection circuit of sampling resistor which collects signals from the current sensor. Signals are received from the both sides of the protection circuit of sampling resistor and sent to the subsequent signal conditioning circuit. Since the current sensor works under conditions of high voltage, a transient surge current and surge voltage may occur. Therefore, a transient voltage suppression diode is disposed by parallel connection at the signal input end as the protection circuit of sampling resistor to prevent a permanent damage of following circuits. To ensure that the whole current of DC arresters is not changed after introduction of the current sensor, the signal conditioning circuit comprising an operational amplifier having high input impedance, low drift, and low noise is selected and connected with the protection circuit of sampling resistor by parallel connection. Voltage signals are filtered by the signal conditioning circuit and sent to the A/D converter of the MSP430F149 micro controller unit where analog-digital conversion is performed. Acquired data is processed by the MSP430F149 micro controller unit and binary digit level signals are sent out by the serial port. The signals are processed by the electro-optical conversion circuit and sent from the floating potential at the high-voltage side to the signal processing unit at the low-voltage side by a fiber. Each current sensor needs only one fiber. The received real-time current waveform digital signals are demodulated by the signal processing unit, as well as other relevant processing, and then the complete waveform of the current that flows through the resistors and other required information is obtained.

The current sensor of the invention is an active sensor. The battery module is separately connected to and provides power for the signal conditioning circuit, the signal acquisition circuit, and the electro-optical conversion circuit. Additionally, because the measurement is performed under harsh environment such as high voltage and strong electromagnetic fields, a large amount of interfering signals exists on the spot. To prevent the to-be-measured signals and the circuits of the current sensor from interfering, according to one embodiment of the invention, a metal casing of aluminum is used as a shield, and therefore the whole current sensor is enclosed by the aluminum casing and communicates with the outside only through a fiber. So electromagnetic interference is inhibited, the complex electromagnetic environment is screened, and signals acquired by the current sensor are true and reliable. That the shape of the current sensor is the same as a metallic pad minimizes the effect of the introduction of the current sensor on the original potential distribution of the metal oxide arrester.

Advantages of the stator of the invention are summarized below:
1) the whole current flowing through the metal oxide resistors of the arrester is acquired by the current sensor in real time and more accurately;
2) the acquired signals are sent by a fiber to the signal processing unit at a low voltage side for further processing, so other current-related information such as effective value, peak value, and frequency is obtained; and
3) the current sensor has a good real time, high accuracy, low power consumption, good electromagnetic compatibility, and strong anti-interference capability even under harsh electromagnetic environment.

BRIEF DESCRIPTION OF THE DRAWINGS

The invention is described hereinbelow with reference to accompanying drawings, in which.

DETAILED DESCRIPTION OF THE EMBODIMENTS

For further illustrating the invention, embodiments detailing a current sensor for measuring the inhomogeneity of potential distribution of an arrester are described below. It should be noted that the following embodiments are intended to describe and not to limit the invention.

Embodiment

Figure 1:
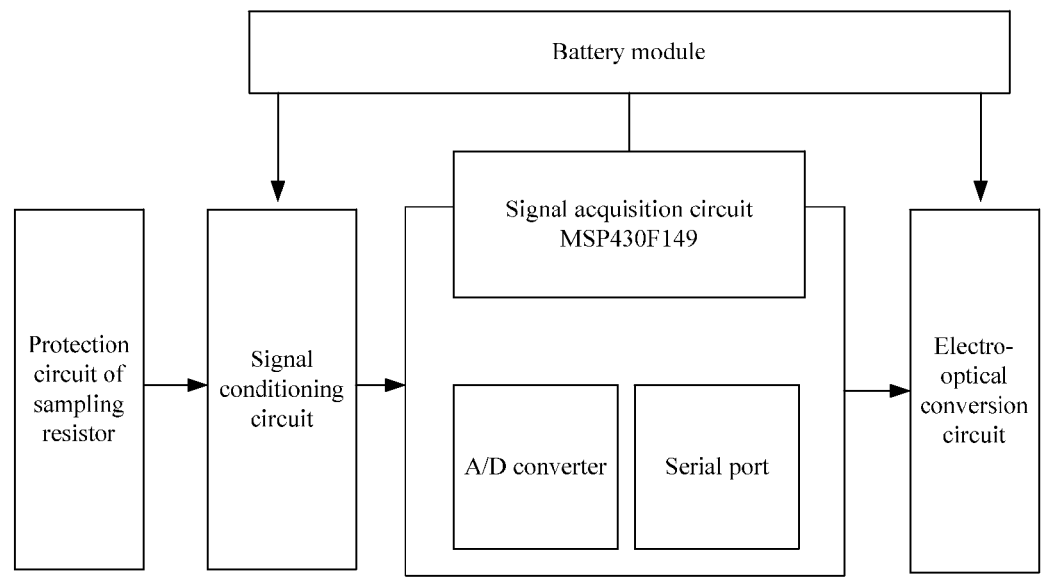
FIG. 1 is a circuit schematic diagram of a current sensor according to one embodiment of the invention.

In this embodiment, a current sensor is enclosed by an aluminum casing. As shown in FIG. 1, the current sensor for measuring the inhomogeneity of potential distribution of an arrester, comprises a protection circuit of sampling resistor, a signal conditioning circuit, a signal acquisition circuit, an electro-optical conversion circuit, and a battery module. The protection circuit of sampling resistor, the signal conditioning circuit, the signal acquisition circuit, and the electro-optical conversion circuit are connected sequentially and electrically. The battery module is separately connected to and provides power for the signal conditioning circuit, the signal acquisition circuit, and the electro-optical conversion circuit.

The signal acquisition circuit comprises MSP430F149 micro controller unit comprising an A/D converter and a serial port.

The current sensor is an active sensor and put in a high floating potential. The battery module is 3.6 V lithium batteries.

Figure 2:
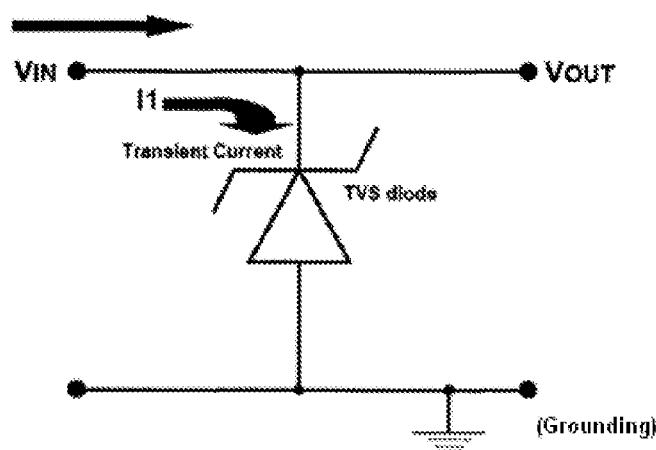
FIG. 2 is a circuit schematic diagram of a protection circuit of sampling resistor of FIG. 1 according to one embodiment of the invention.

As shown in FIG. 2, the protection circuit of sampling resistor is a surge protector and comprises a transient voltage suppression diode, and the transient voltage suppression diode is connected to the sampling resistor by parallel connection to protect the circuit.

Figure 3:
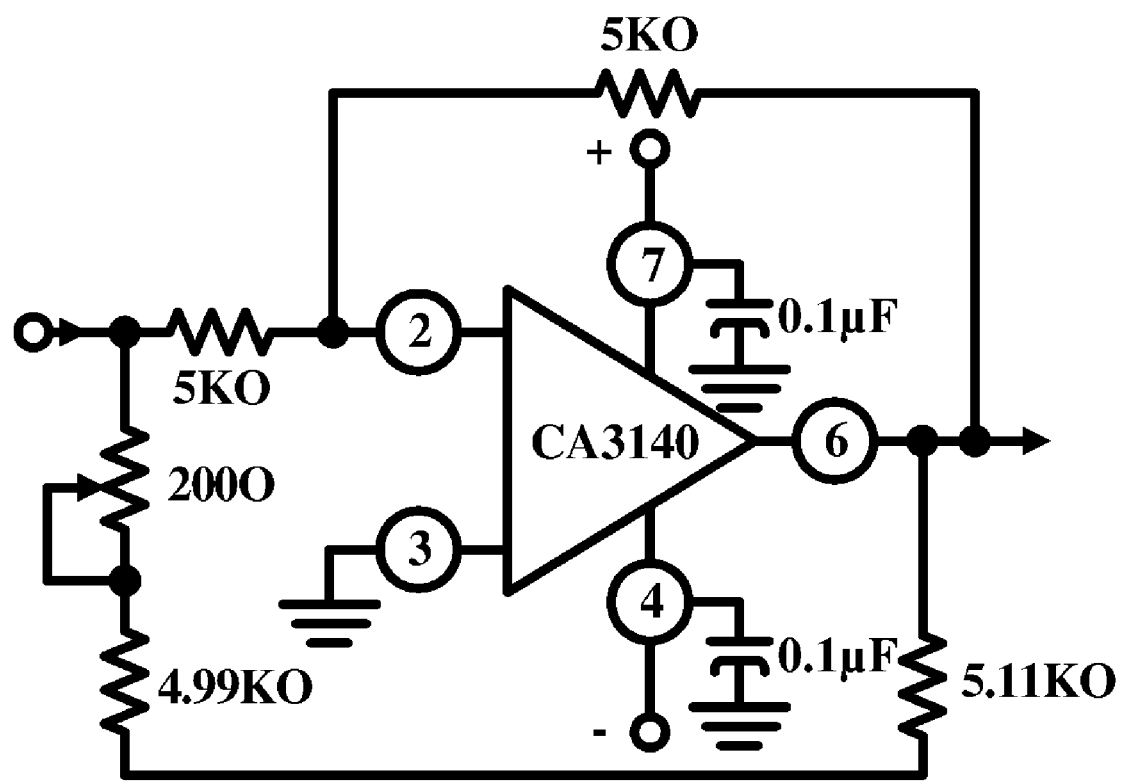
FIG. 3 is a circuit schematic diagram of a signal conditioning circuit of FIG. 1 according to one embodiment of the invention.

As shown in FIG. 3, the signal conditioning circuit adopts high quality of operational amplifier as a core element and supplies appropriate signal voltage for the signal acquisition circuit. Input signals are received by a first pin 2 of the operational amplifier CA3140, and the processed signals are sent to the signal acquisition circuit by a second pin 6.

Figure 4:
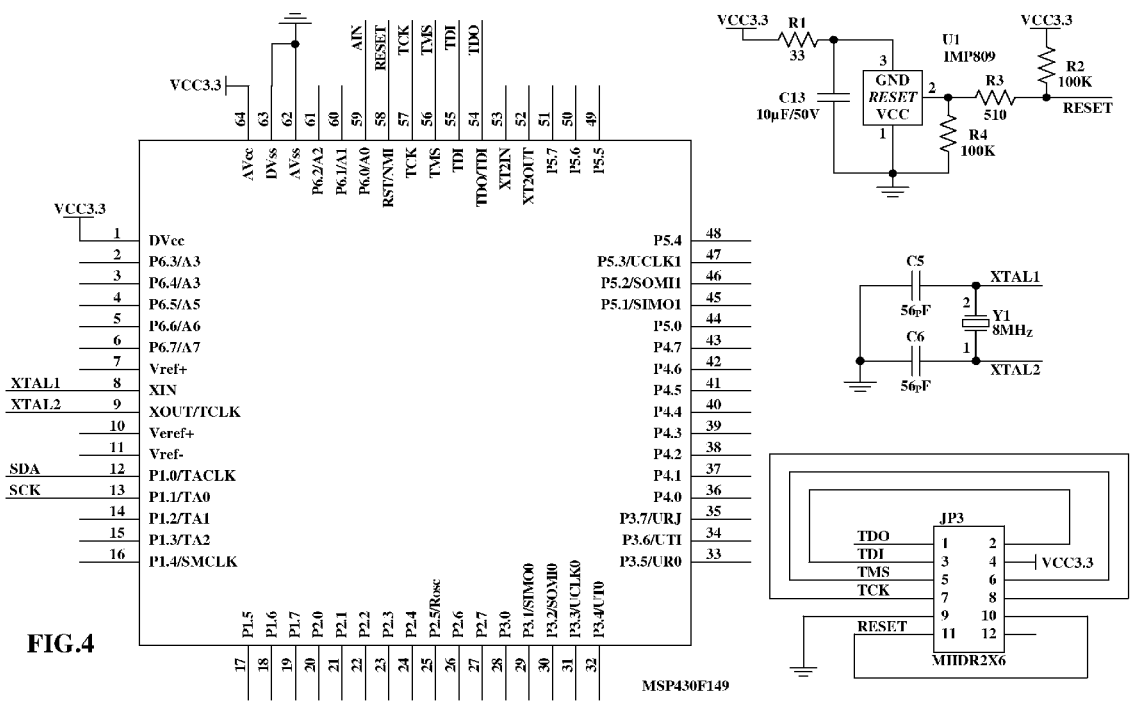
FIG. 4 is a circuit schematic diagram of a signal acquisition circuit of FIG. 1 according to one embodiment of the invention.

As shown in FIG. 4, the signal acquisition circuit comprises MSP430F149 micro controller unit as a signal acquisition and communication chip. A 12 bits A/D converter converts analog voltage signals into binary digital signals, and the serial port sends encoded binary digital signals to the electro-optical conversion circuit. The encoded binary digital signals are processed by the electro-optical conversion circuit and sent to a signal processing unit at a low voltage side by a single fiber channel for further processing. The signal acquisition circuit mainly comprises MSP430F149 micro controller unit, a reset circuit, a JTAG interface, and a clock oscillator. Signals are acquired by a P1 port, processed by the micro controller unit, and sent to the electro-optical conversion circuit by the serial port. The reset circuit, the JTAG interface, and the clock oscillator are separately connected to the micro controller unit according to the pin labels in FIG. 4.

Figure 5:
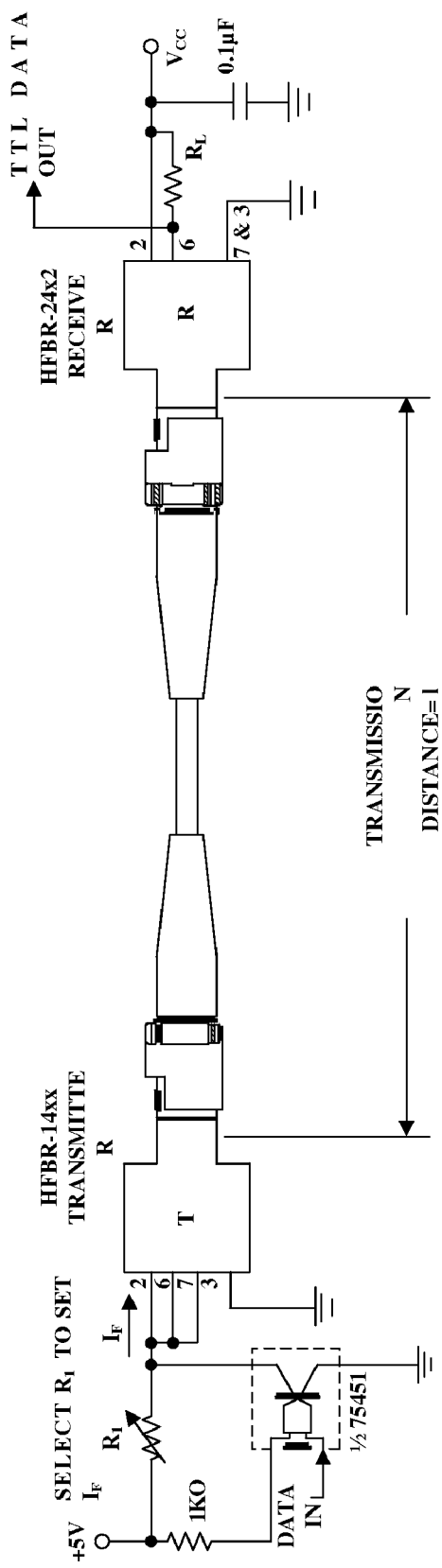
FIG. 5 is a circuit schematic diagram of an electro-optical conversion circuit of FIG. 1 according to one embodiment of the invention.

As shown in FIG. 5, the electro-optical conversion circuit mainly comprises an electro-optical converter HFBR1412. The circuit end receives signals from the serial port of micro controller unit. The luminescence end is connected to a fiber. L represents a transmission distance, and HFBR2412 is an optical-electro converter.

Figure 6:
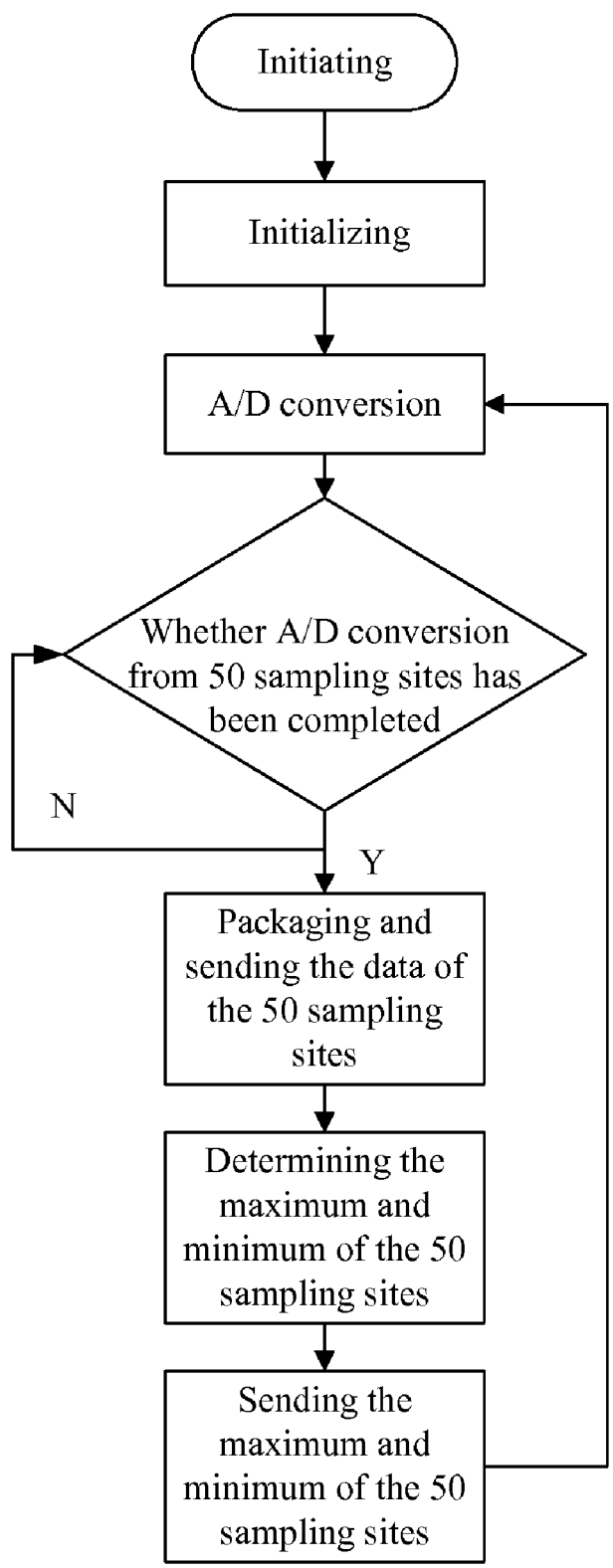
FIG. 6 is a flow chart of operating procedure of MSP430F149 micro controller unit.

As shown in FIG. 6, in order to accurately measure the current data flowing through the arrester resistors, MSP430F149 micro controller unit is run in accordance with a preset program. The preset program controls the working of the signal acquisition circuit, and the flow chart of the program is shown in FIG. 2. When MSP430F149 micro controller unit is initiated, the program starts running, comprising the steps of:
1) initializing, setting modules of MSP430F149 micro controller unit that will be used to meet the requirement of signal acquisition, and shutting down modules that will not be used so as to reduce power consumption;
2) acquiring signals and performing A/D conversion;
3) determining whether A/D conversion from 50 sampling sites has been completed, if so, then going to the next step, if not, continuing sampling;
4) packaging and sending the data of the 50 sampling sites;
5) determining the maximum and minimum of the 50 sampling sites and removing interfering signals;
6) sending the maximum and minimum of the 50 sampling sites in this cycle; and
7) returning to the step 2) after completing sampling a site for acquiring current signals of next sample site.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A current sensor for measuring inhomogeneity of potential distribution of an arrester, the current sensor comprising:
a) a metal casing;
b) a protection circuit of a sampling resistor;
c) a signal conditioning circuit;

d) a signal acquisition circuit;
e) an electro-optical conversion circuit; and
f) a battery module;
wherein
being enclosed by said metal casing, said protection circuit of a sampling resistor, said signal conditioning circuit, said signal acquisition circuit, and said electro-optical conversion circuit are connected sequentially and electrically;
said battery module is separately connected to and provides power for said signal conditioning circuit, said signal acquisition circuit, and said electro-optical conversion circuit;
said protection circuit of a sampling resistor comprises a transient voltage suppression diode, and said transient voltage suppression diode is connected to said sampling resistor by parallel connection;
said signal acquisition circuit comprises MSP430F149 micro controller unit as a signal acquisition and communication chip, said MSP430F149 micro controller unit comprises an A/D converter and a serial port, said A/D converter converts analog voltage signal into binary digital signal in real time, and said serial port sends encoded binary digital signal to said electro-optical conversion circuit;
said encoded binary digital signal is processed by said electro-optical conversion circuit and sent to a signal processing unit at a low voltage side by a single fiber channel for further processing; and
said metal casing is made of aluminum, and the shape of said metal casing is the same as that of an original metallic pad of said arrester.

2. A current sensor for measuring inhomogeneity of potential distribution of an arrester, the current sensor comprising:
a) a metal casing;
b) a protection circuit of a sampling resistor;
c) a signal conditioning circuit;
d) a signal acquisition circuit;
e) an electro-optical conversion circuit; and
f) a battery module;
wherein
being enclosed by said metal casing, said protection circuit of a sampling resistor, said signal conditioning circuit, said signal acquisition circuit, and said electro-optical conversion circuit are connected sequentially and electrically;
said battery module is separately connected to and provides power for said signal conditioning circuit, said signal acquisition circuit, and said electro-optical conversion circuit;
said protection circuit of a sampling resistor comprises a transient voltage suppression diode, and said transient voltage suppression diode is connected to said sampling resistor by parallel connection;
said signal acquisition circuit comprises MSP430F149 micro controller unit as a signal acquisition and communication chip, said MSP430F149 micro controller unit comprises an A/D converter and a serial port, said A/D converter converts analog voltage signal into binary digital signal in real time, and said serial port sends encoded binary digital signal to said electro-optical conversion circuit; and
said metal casing is made of aluminum, and the shape of said metal casing is the same as that of an original metallic pad of said arrester.

3. A current sensor for measuring inhomogeneity of potential distribution of an arrester, the current sensor comprising:
a) a metal casing;
b) a protection circuit of a sampling resistor;
c) a signal conditioning circuit;
d) a signal acquisition circuit;
e) an electro-optical conversion circuit; and
f) a battery module; wherein
being enclosed by said metal casing, said protection circuit of a sampling resistor, said signal conditioning circuit, said signal acquisition circuit, and said electro-optical conversion circuit are connected sequentially and electrically;
said battery module is separately connected to and provides power for said signal conditioning circuit, said signal acquisition circuit, and said electro-optical conversion circuit;
said protection circuit of a sampling resistor comprises a transient voltage suppression diode, and said transient voltage suppression diode is connected to said sampling resistor by parallel connection; and
said metal casing is made of aluminum, and the shape of said metal casing is the same as that of an original metallic pad of said arrester.

4. A current sensor for measuring inhomogeneity of potential distribution of an arrester, the current sensor comprising:
a) a metal casing;
b) a protection circuit of a sampling resistor;
c) a signal conditioning circuit;
d) a signal acquisition circuit;
e) an electro-optical conversion circuit; and
f) a battery module; wherein
being enclosed by said metal casing, said protection circuit of a sampling resistor, said signal conditioning circuit, said signal acquisition circuit, and said electro-optical conversion circuit are connected sequentially and electrically;
said battery module is separately connected to and provides power for said signal conditioning circuit, said signal acquisition circuit, and said electro-optical conversion circuit; and
said metal casing is made of aluminum, and the shape of said metal casing is the same as that of an original metallic pad of said arrester.

* * * * *